United States Patent
Sirard et al.

(10) Patent No.: US 9,673,037 B2
(45) Date of Patent: Jun. 6, 2017

(54) SUBSTRATE FREEZE DRY APPARATUS AND METHOD

(75) Inventors: Stephen M. Sirard, Austin, TX (US); Diane Hymes, San Jose, CA (US); Alan M. Schoepp, Ben Lemond, CA (US)

(73) Assignee: Law Research Corporation, Fremont, CA (US)

( * ) Notice: Subject to any disclaimer, the term of this patent is extended or adjusted under 35 U.S.C. 154(b) by 332 days.

(21) Appl. No.: 13/273,090

(22) Filed: Oct. 13, 2011

(65) Prior Publication Data

US 2012/0304483 A1    Dec. 6, 2012

Related U.S. Application Data

(60) Provisional application No. 61/491,727, filed on May 31, 2011.

(51) Int. Cl.
| | | |
|---|---|---|
| *F26B 5/06* | (2006.01) | |
| *H01L 21/02* | (2006.01) | |
| *H01L 21/67* | (2006.01) | |
| *H01L 21/683* | (2006.01) | |

(52) U.S. Cl.
CPC .. *H01L 21/02057* (2013.01); *H01L 21/67034* (2013.01); *H01L 21/67109* (2013.01); *H01L 21/67115* (2013.01); *H01L 21/67248* (2013.01); *H01L 21/6831* (2013.01)

(58) Field of Classification Search
CPC .................................................. H01L 21/02057
USPC ..................................... 34/289, 285–288, 92
See application file for complete search history.

(56) References Cited

U.S. PATENT DOCUMENTS

| | | | |
|---|---|---|---|
| 4,771,730 A | | 9/1988 | Tezuka |
| 4,917,123 A | * | 4/1990 | McConnell ............. B05C 3/109 |
| | | | 134/100.1 |
| 5,740,016 A | | 4/1998 | Dhindsa |
| 5,835,334 A | | 11/1998 | McMillin et al. |
| 6,337,277 B1 | * | 1/2002 | Chou et al. ....... H01L 21/31138 |
| | | | 257/E21.256 |
| 6,567,258 B2 | | 5/2003 | Sexton et al. |
| 6,669,783 B2 | | 12/2003 | Sexton et al. |
| 6,858,091 B2 | * | 2/2005 | Boyd ................ H01L 21/02057 |
| | | | 134/10 |

(Continued)

FOREIGN PATENT DOCUMENTS

| | | |
|---|---|---|
| EP | 0423761 A2 | 4/1991 |
| JP | 62-149137 | 7/1987 |

(Continued)

OTHER PUBLICATIONS

International Search Report dated Jan. 2, 2013 from International Patent Application No. PCT/US2012/039855.

(Continued)

*Primary Examiner* — Kenneth Rinehart
*Assistant Examiner* — Bao D Nguyen
(74) *Attorney, Agent, or Firm* — Beyer Law Group LLP

(57) ABSTRACT

An apparatus for freeze drying a substrate is provided. A chamber for receiving a substrate is provided. An electrostatic chuck (ESC) for supporting and electrostatically clamping the substrate is within the chamber. A temperature controller controls the temperature of the electrostatic chuck. A condenser is connected to the chamber. A vacuum pump is in fluid connection with the chamber.

11 Claims, 6 Drawing Sheets

(56) References Cited

U.S. PATENT DOCUMENTS

| | | | |
|---|---|---|---|
| 2002/0050573 A1* | 5/2002 | Suguro | H01J 37/3171 250/492.21 |
| 2002/0132184 A1* | 9/2002 | Babcock | G03F 7/30 430/270.1 |
| 2003/0172954 A1 | 9/2003 | Verhaverbeke | |
| 2004/0261946 A1* | 12/2004 | Endoh et al. | 156/345.15 |
| 2006/0059708 A1 | 3/2006 | Kim | |
| 2006/0137212 A1* | 6/2006 | Nomine | 34/284 |
| 2007/0023790 A1* | 2/2007 | Ohnuma et al. | 257/267 |
| 2007/0231109 A1* | 10/2007 | Pak et al. | C23C 16/54 414/217 |
| 2008/0286978 A1* | 11/2008 | Chen et al. | 438/713 |
| 2009/0139657 A1* | 6/2009 | Lee et al. | H01J 37/32357 156/345.24 |
| 2010/0081274 A1* | 4/2010 | Ishizaka et al. | 438/653 |
| 2011/0048034 A1* | 3/2011 | Yoneda et al. | 62/3.6 |
| 2011/0154843 A1* | 6/2011 | Ko et al. | 62/259.2 |
| 2012/0281333 A1* | 11/2012 | McRay | H01L 21/6831 361/234 |

FOREIGN PATENT DOCUMENTS

| | | |
|---|---|---|
| JP | 63-72877 | 4/1988 |
| JP | 4-242930 | 8/1992 |
| JP | 5-272867 | 10/1993 |
| JP | 6-224116 | 8/1994 |
| JP | 7-20637 | 1/1995 |
| JP | 9-275085 | 10/1997 |
| JP | 2004-266212 | 9/2004 |
| JP | 2008/525750 | 7/2008 |
| JP | 2010-140944 | 6/2010 |
| WO | WO 2007-043755 | 4/2007 |

OTHER PUBLICATIONS

Written Opinion dated Jan. 2, 2013 from International Patent Application No. PCT/US2012/039855.
Office Action dated Feb. 24, 2016 from Japanese Patent Application 2014-513642.
Office Action dated Apr. 8, 2016 from Chinese Patent Application 201280026928.6.

* cited by examiner

SUBSTRATE FREEZE DRY APPARATUS AND METHOD

CROSS REFERENCE TO RELATED APPLICATIONS

This application claims priority under 35 U.S.C. §119 from U.S. Provisional Patent Application No. 61/491,727, filed May 31, 2011, entitled NOVEL DAMAGE-FREE METHOD FOR REMOVING LIQUIDS FROM SEMICONDUCTOR WAFERS CONTAINING SEMICONDUCTING, MEMS, OR PHOTOELECTRIC DEVICES, which is incorporated herein by reference for all purposes.

BACKGROUND OF THE INVENTION

The present invention relates to the formation of semiconductor devices. More specifically, the invention relates to an apparatus or method for removing liquids from a substrate during the formation of semiconductor devices.

During semiconductor wafer processing, wet processing requires the subsequent removal of liquid from semiconductor devices.

As semiconductor devices continue to scale down to smaller sizes, higher aspect ratio structures are required to achieve the desired device performance. The fabrication of microelectronic/semiconductor devices requires a repetitive flow of multiple processing steps such as, material deposition, planarization, feature patterning, feature etching, and feature cleaning. The drive towards higher aspect ratio structures creates processing challenges for many of these traditional fabrication steps. Wet processes such as etch and clean, which typically make up greater than ~25% of the process flow, are particularly challenging on high aspect ratio features due to the capillary forces that are generated during drying. The strength of these capillary forces are dependent on the surface tension and contact angle of the etch, clean, or rinse fluids that are being dried, as well as the feature spacing and aspect ratio. If the forces generated during drying are too high, then the high aspect ratio features will collapse onto each other and stiction may occur. Feature collapse and stiction will severely degrade the device yield.

SUMMARY OF THE INVENTION

To achieve the foregoing and in accordance with the purpose of the present invention, an apparatus for freeze drying a substrate is provided. A chamber for receiving a substrate is provided. An electrostatic chuck (ESC) for supporting and electrostatically clamping the substrate is within the chamber. A temperature controller controls the temperature of the electrostatic chuck. A condenser is connected to the chamber. A vacuum pump is in fluid connection with the chamber.

In another manifestation of the invention, a method, for freeze drying a liquid from a substrate is provided. The liquid is displaced with a drying chemistry. The substrate is placed on an electrostatic chuck in a drying chamber. The substrate is chucked to the electrostatic chuck. The electrostatic chuck is used to back side supercool the substrate below the freezing point of the drying chemistry to freeze the drying chemistry. The pressure in the chamber is reduced to remove the frozen drying chemistry. The substrate is heated to sublimate the drying chemistry without melting the drying chemistry.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
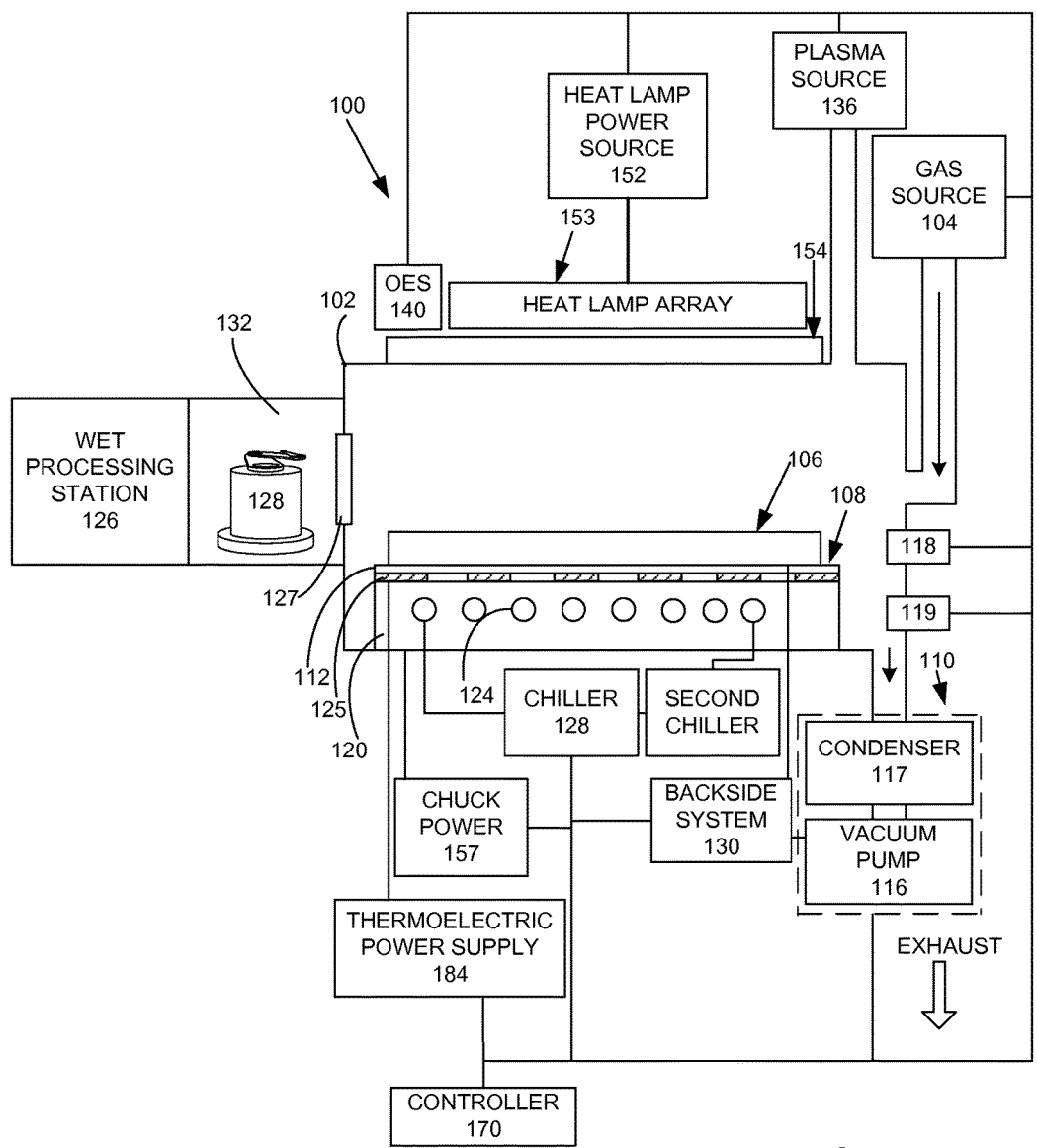
FIG. 1 is a schematic illustration of a freeze-drying device in an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the current and prior art, alternative rinsing liquids with lower surface tension than deionized water have been implemented to prevent feature collapse. While this method has been successful for lower aspect ratio structures, it suffers the same collapse and stiction issues as deionized water at higher aspect ratios and smaller feature spacing. This failing is due to the fact that these lower surface tension fluids still possess a finite surface tension that generates forces during drying that are too strong for the fragile features. An alternative method to dry high aspect ratio structures is to dissolve and flush the rinsing fluid with a supercritical fluid. Supercritical fluids should generally be free of surface tension and thus eliminate the capillary forces that result in feature collapse. Despite the advantages of supercritical fluids, there are several technical and manufacturing challenges in implementing these fluids. These challenges include high equipment and safety costs, long process times, variable solvent quality during the process, extreme process sensitivity due to the diffuse and tunable nature of the fluid, and wafer defectivity/contamination issues arising from the interaction of the fluid with the chamber parts. Another strategy for preventing collapse of high aspect ratio structures is to add a mechanical bracing structure that supports the features. There are several tradeoffs with this approach including higher cost and process complexity that negatively impact throughput and yield. Furthermore, bracing is not a robust solution since it is limited to certain types of structures. Thus, alternative methods and systems for damage-free removal of liquids from semiconductor/microelectronic devices are desirable.

An embodiment of the invention enables the damage-free removal of liquids from semiconductor wafers. The method proceeds by cooling a wafer containing a layer of liquid to a temperature below the liquid's triple point, eutectic temperature, or glass transition temperature, thereby inducing a change in the layer from liquid to solid or glass. The pressure of the drying chamber is lowered below the vapor pressure of the frozen fluid and the temperature of the wafer is uniformly increased in a controlled manner. These conditions result in direct sublimation of the frozen layer. These conditions are maintained until all of the frozen fluid is removed through sublimation. This method eliminates the vapor/liquid interface between the high aspect ratio features. The surface tension of the frozen material is extremely low. Therefore, the forces that are generated during traditional liquid evaporation drying are eliminated and collapse-free drying of the microelectronic topography/high aspect ratio features is achieved.

As shown in FIG. 1, the freeze drying system 100 in this embodiment comprises a drying chamber 102. A gas source/gas supply mechanism 104 is in fluid connection with the drying chamber 102. The gas source/gas supply mechanism 104 provides part of an atmosphere control system that controls the pressure and type of gas in the drying chamber 102. An electrostatic chuck (ESC) 108 is placed in the chamber to support a substrate 106, such as a wafer. The freeze drying system 100 further comprises a wet transfer station 132, which provides a method for transferring the wet wafer into the freeze drying chamber 102 and provides a vacuum seal through which the atmosphere can be controlled and the drying process pressure can be achieved, a condenser 117, a vacuum pump 116, a plasma source 136, a heat lamp array 153, a heat lamp power source 152, an optical emission spectroscopy (OES) system 140, where the heat lamp array 153 and OES system 140 are adjacent to a window 154 forming one side of the drying chamber 102.

In this embodiment the ESC 108 comprises a contact layer 112, a layer of thermoelectric devices 116, and a body 120. The body 120 has a plurality of channels 124. The channels 124 are in fluid connection with a chiller 128. The chiller cools and provides a fluid to the channels, through which the fluid passes, which cools the body 120 of the ESC 108. A thermoelectric power supply 184 is electrically connected to the layer of thermoelectric devices 116. The thermoelectric power supply 184 provides a voltage to the thermoelectric devices 116. The thermoelectric power supply 184 uses the magnitude and direction of the voltage to determine whether the thermoelectric devices 116 provide a heat differential or cooling differential and the magnitude of such a differential between the ESC body 120 and the contact layer 112. A chuck power supply 157 provides a clamping voltage to electrostatically clamp the substrate 106 onto the ESC 108. A backside cooling and heating system 130 is connect to the ESC 108 and provides a fluid, such as helium, through the ESC 108 to the backside of the substrate 106 to increase heat transfer between the ESC 108 and the substrate 106. The backside cooling/heating system is also connected to the vacuum pump 116 which allows for the substrate to be vacuum clamped to the ESC 108. An example of a backside cooling system is described in U.S. Pat. No. 5,835,334 entitled, "Variable High Temperature Chuck for High Density Plasma Chemical Vapor Deposition," by McMillin et al., which is incorporated by reference for all purposes.

In this embodiment of the invention, the condenser 117 and the vacuum pump 116 are combined in a cryopump 110 that both provides a vacuum and condenses vapor. A pirani pressure gauge 118 and a capacitance manometer 119 are connected to the drying chamber 102.

A controller 170 is controllably connected to the thermoelectric power supply 184, the chiller 128, the chuck power supply 157, the cryopump 110, the gas source 104, the plasma source 136, the heat lamp power source 152, the backside cooling and heating system, the pirani pressure gauge 118, the capacitance manometer, and the OES 140.

Figure 2:
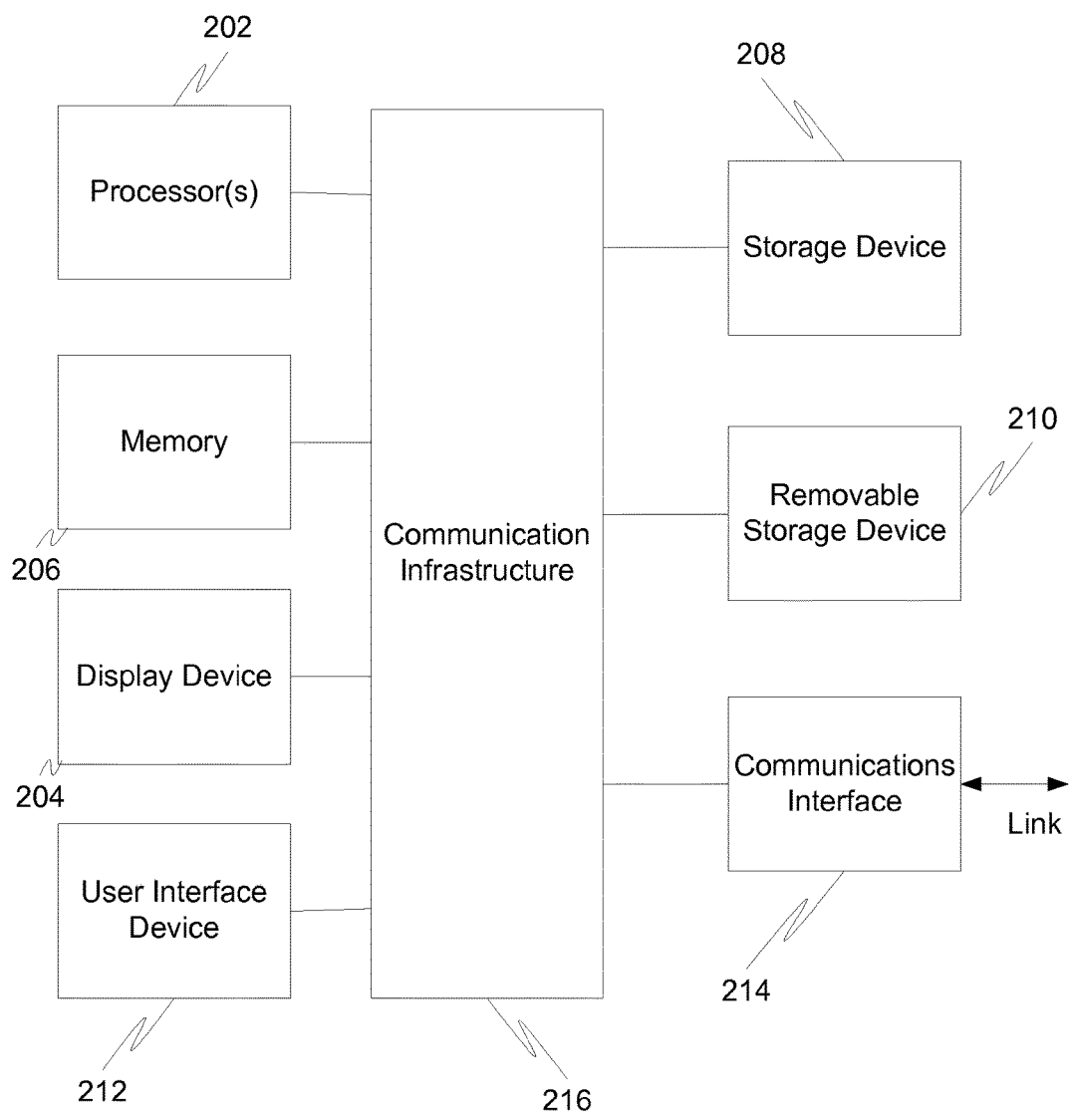
FIG. 2 illustrates a computer system, which is suitable for implementing a controller used in embodiments of the present invention.

FIG. 2 is a high level block diagram showing a computer system 200, which is suitable for implementing a controller 170 used in embodiments of the present invention. The computer system may have many physical forms ranging from an integrated circuit, a printed circuit board, and a small handheld device up to a huge super computer. The computer system 200 includes one or more processors 202, and further can include an electronic display device 204 (for displaying graphics, text, and other data), a main memory 206 (e.g., random access memory (RAM)), storage device 208 (e.g., hard disk drive), removable storage device 210 (e.g., optical disk drive), user interface devices 212 (e.g., keyboards, touch screens, keypads, mice or other pointing devices, etc.), and a communication interface 214 (e.g., wireless network interface). The communication interface 214 allows software and data to be transferred between the computer system 200 and external devices via a link. The system may also include a communications infrastructure 216 (e.g., a communications bus, cross-over bar, or network) to which the aforementioned devices/modules are connected.

Information transferred via communications interface 214 may be in the form of signals such as electronic, electromagnetic, optical, or other signals capable of being received by communications interface 214, via a communication link that carries signals and may be implemented using wire or cable, fiber optics, a phone line, a cellular phone link, a radio frequency link, and/or other communication channels. With such a communications interface, it is contemplated that the one or more processors 202 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
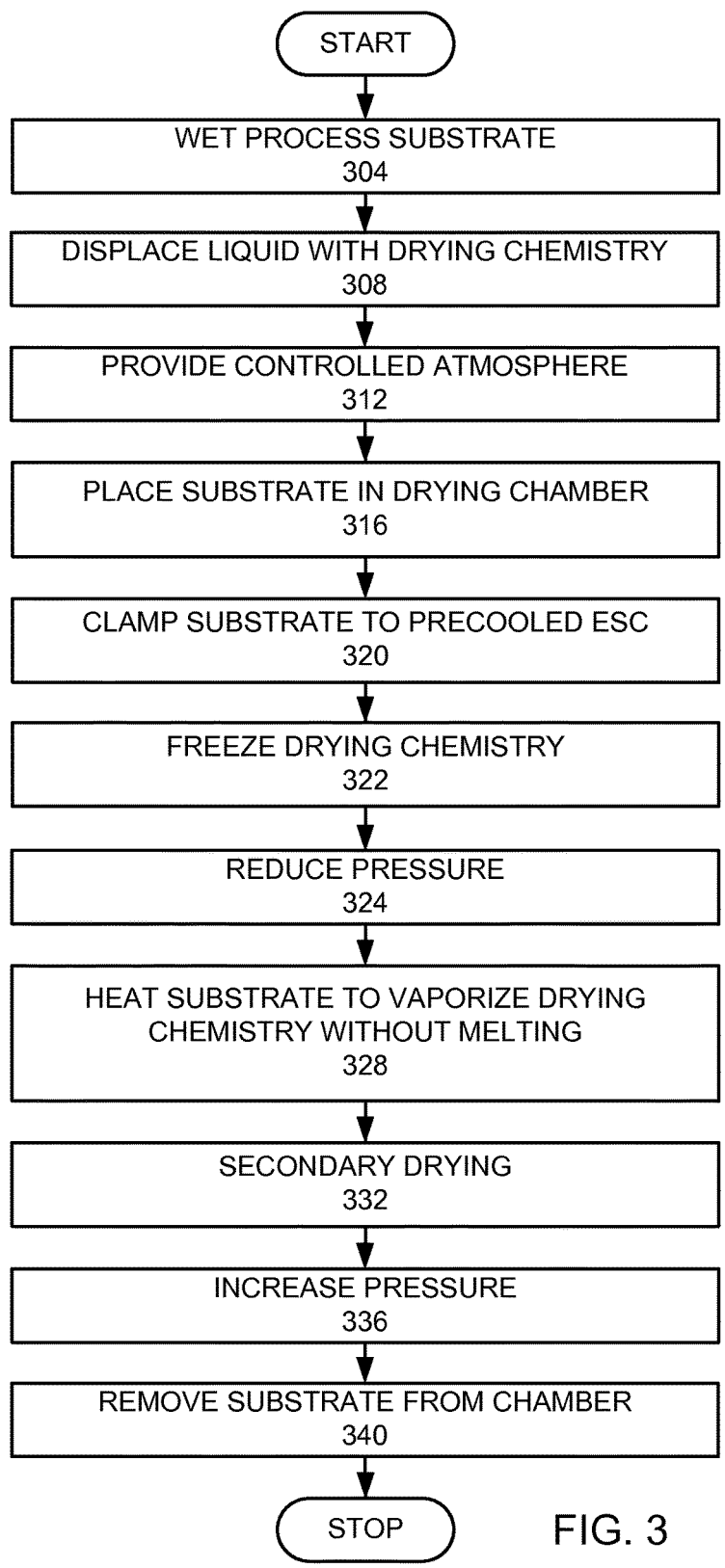
FIG. 3 is a high level flow chart of an embodiment of the invention.

To facilitate understanding, FIG. 3 is a high level flow chart of a process that may be used in an embodiment of the invention. A wet process is used on a substrate (step 304), which leaves a liquid on the substrate. The liquid is replaced with a drying chemistry (step 308), which leaves a drying chemistry liquid on the substrate. A controlled atmosphere is provided in the drying chamber (step 312). This may be accomplished by flowing nitrogen or nitrogen and hydrogen into the drying chamber, which provides an oxygen free, inert, or reducing atmosphere. The substrate is placed in a drying chamber (step 316). The substrate is clamped to a precooled electrostatic chuck (step 320), which is used to quickly cool down the substrate and causes the drying chemistry to freeze (step 322). The temperature of the ESC may be subsequently increased to anneal any meta-stable states out of the frozen layer without melting the drying chemistry. The pressure in the drying chamber is reduced below the vapor pressure of the drying chemistry (step 324). The substrate is heated to sublimate the drying chemistry, without melting the drying chemistry (step 328). If required, additional heat is provided for a secondary drying while simultaneously lowering the chamber pressure (step 332). Afterwards, the pressure in the drying chamber is increased (step 336). The substrate is removed from the drying chamber (step 340).

Example

In an example of an implementation of the invention, features for a memory device are etched into a layer on a silicon wafer to form memory lines with a critical dimension (CD) of less than 40 nm and a pitch of less than 80 nm. A wet process is used to remove an etch mask and clean the memory lines leaving a cleaning liquid on the surface of the wafer (step 304). In this example, the cleaning liquid is deionized water (DI). The cleaning liquid is displaced with a drying chemistry (step 308). In this example, the drying chemistry is a solution of 90% tert-butanol (TBA) and 10% water. In this example, the cleaning liquid is displaced with the drying chemistry is by flowing the drying chemistry on the substrate as the substrate is spun.

Figure 4A:
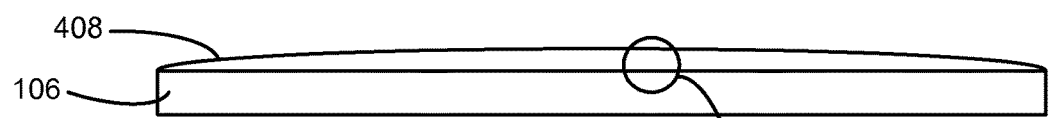
FIG. 4A is a cross sectional view of the substrate after the drying chemistry has displaced the cleaning liquid.
Figure 4B:
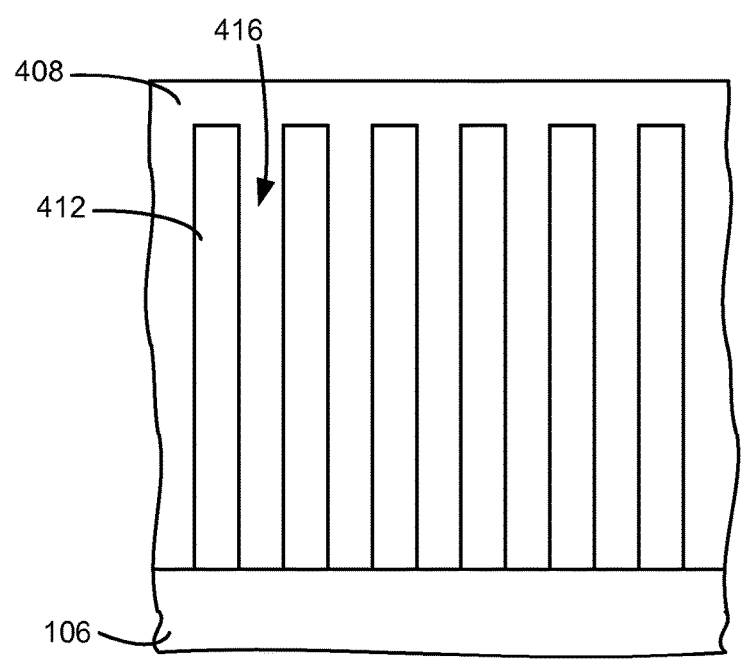
FIG. 4B is an enlarged view of a section of FIG. 4A.

FIG. 4A is a cross sectional view of the substrate 106 after the drying chemistry 408 has displaced the cleaning liquid. FIG. 4B is an enlarged view of a section of FIG. 4A, as indicated, showing memory lines 412 and etched features 416 over a substrate 106 over which the drying chemistry 408 is placed. One or more layers may be placed between the substrate 106 and the memory lines 412.

A controlled atmosphere is provided in the drying chamber 102 (step 312) of a drying chamber 102, such as shown in FIG. 1. In this example, an inert, oxygen free or reducing atmosphere is provided by flowing gas into the drying chamber 102 from the gas source 104. In this example, the gas is nitrogen.

The substrate 106 is placed in a drying chamber (step 316), such as the drying chamber 100 shown in FIG. 1. In this example, the wet transfer station 132 is used to transfer the substrate 106 into the drying chamber 102 at atmospheric pressure and room temperature. The wet transfer station 132 would be connected between a wet processing station 126 and the drying chamber 102 and may have a robotic mechanism 128 for transferring a substrate from the wet processing station to the drying chamber 102. After drying, the robotic mechanism 128 in the wet transfer station may be used to remove the substrate from the drying chamber 102 to another chamber. The wet transfer station would be able to handle wet substrates by providing a controlled atmosphere to prevent drying or to prevent other chemical changes to the wet substrate.

Because a solution of 90% TBA and 10% water is relatively viscous at room temperature the solution does not tend to spill during the transfer. The substrate 106 is placed on the ESC 108. The chiller is set so that the body of the ESC 120 has been precooled to a temperature of about −40° C.

before the substrate 106 is placed on the ESC 108. In this example, the thermoelectric power supply provides no voltage to the thermoelectric devices to create a temperature differential between the ESC body 120 and the contact layer 112, of 0° C. so that the contact layer 112 is precooled to −40° C. The chuck power supply 157 provides a chucking voltage to electrostatically clamp the substrate 106 to the ESC 108 (step 320). The backside cooling and heating system 130 provides a backside gas pressure of helium between the contact layer 112 and the substrate 106 to improve the heat transfer between the contact layer 112 and substrate 106 and improve the temperature uniformity of the substrate 106.

The drying chemistry 408 is completely frozen (step 322) by the cooling from the ESC 108. A fixed time may be determined for the freezing process.

In this example, a cryopump 110 provides a condenser 117 and vacuum pump 116, which is used to pump down the drying chamber 102 to a reduced pressure between 0.1-1000 mTorr (step 324). The substrate is then heated to sublimate the drying chemistry without melting the drying chemistry (step 328). In this example the heating is provided by changing the temperature differential provided by the thermoelectric devices by applying a voltage to the thermoelectric devices. In this example, the temperature differential is 10° C. so that the contact layer 112 is placed at a temperature of −30° C. In this example, the chiller 128 is maintained at a constant temperature and the thermoelectric devices 125 are used to provide additional cooling and/or heating. This allows for a quicker, more efficient and more precise change in temperature as the temperature of the contact layer 112 cycles between a temperature for freezing the drying chemistry, any annealing process, and a temperature for sublimating the drying chemistry in a freeze dry process. In this freeze dry process, a low pressure is used to sublime the solid drying chemistry directly to a gas phase by maintaining a pressure below the vapor pressure of the frozen drying chemistry. The condenser 117 reduces the vaporized drying chemistry that reaches the vacuum pump to maintain the efficiency of the vacuum pump 116. Because the freeze drying process sublimates the vapor, the condenser is preferred to handle the sublimated vapor.

Figure 5A:
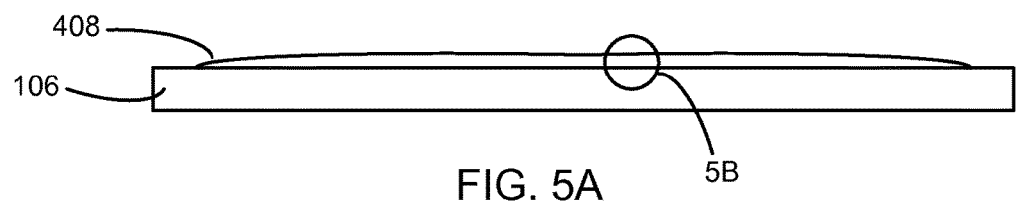
FIG. 5A is a cross sectional view of the substrate after the some of the frozen drying chemistry has been vaporized.
Figure 5B:
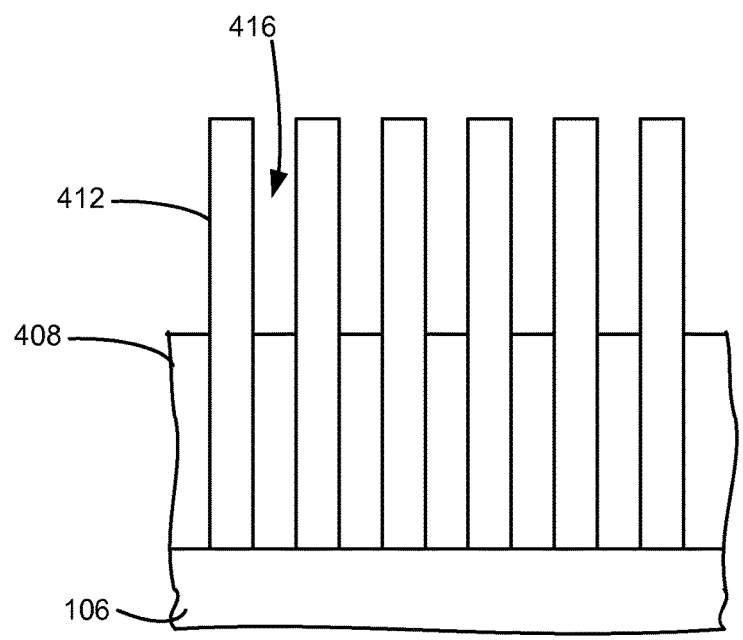
FIG. 5B is an enlarged view of a section of FIG. 5A.

FIG. 5A is a cross sectional view of the substrate 106 after some of the frozen drying chemistry 408 has been sublimated. FIG. 5B is an enlarged view of a section of FIG. 5A, as indicated, showing memory lines 412 and etched features 416 over a substrate 106, where some of the frozen drying chemistry 408 has been sublimated.

The OES system 140 may be used to determine when all of the frozen drying chemistry has been sublimated. In the alternative, the drying may be performed for a fixed time. In another alternative, the pressure convergence of the Pirani gauge and capacitance manometers may be used to determine when all of the frozen chemistry has been sublimated. This example provides a secondary drying by increasing the temperature of the substrate 106 (step 336) and further lowering the chamber pressure. This further increase in temperature may be performed by the thermoelectric devices 116 or by the heat lamp array 153. The purpose of the second drying is to remove any physically adsorbed solvent. After the frozen drying chemistry has been sublimated and removed, in this example, the chamber pressure is increased (step 332).

The substrate is removed from the drying chamber 102 (step 340). During the removal process, the substrate is dechucked by removing the chucking voltage. The pressure in the drying chamber 102 is returned to atmospheric pressure and the wet transfer station 132 is opened.

Alternative Embodiments

Various alternative embodiments of the invention may be provided. In other embodiments of the invention other drying chemistries may be used. Some of the alternative chemistries may be but are not limited to Dimethyl sulfoxide (DSMO), cyclohexane, acetic acid, carbon tetrachloride, isopropanol, dimethyl carbonate, water and mixtures thereof. In an embodiment using (DSMO), where the drying chemistry does not comprise water the controlled atmosphere may have a low humidity. Such drying chemistries may be a pure liquid or a mixture of two or more liquids. In another embodiment, the wet processing liquid may be used as the drying chemistry, so that the wet processing liquid does not need to be displaced by the drying chemistry.

In another embodiment, the displacement of the liquid with the drying chemistry may be performed in the drying chamber. Such processes may spin or may not spin the substrate during the displacement of the liquid with the drying chemistry.

In another embodiment the controlled atmosphere may be any inert gas that contains a low percentage or is free of moisture. Certain inert gases, such as Ar, may have advantages for electrostatically chucking/dechucking the wafers from the ESC. It is believed that if the atmosphere is not controlled, oxygen will be absorbed into the drying chemistry which could cause delamination of the frozen layer, which may increase collapse.

In another embodiment, the chuck is not precooled, but instead the temperature of the chuck is ramped down after the substrate is placed on the chuck. In another embodiment a vacuum or mechanical chuck is used instead of an electrostatic chuck. In another embodiment the substrate is placed on a platen, where the substrate is not chucked. This embodiment would have a slower cooling time and therefore increase processing time, but may provide other advantages. In another embodiment, liquid nitrogen may contact the substrate to provide the cool down.

Various different devices may be used to achieve chamber vacuum, such as, a mechanical pump and/or a turbo molecular pump. An inert gas, such as Ar, He, or $N_2$, may be supplied to the chamber at a controlled flow rate to maintain the desired chamber pressure. In an alternative embodiment, no gas is supplied to maintain desired chamber pressure. Preferably, the chamber pressure is maintained at <5 mTorr. For backside cooling or heating, an inert gas, such as but not limited to He or Ar, is supplied to the backside of the electrostatically chucked wafer at a pressure preferably in the range of 1 Torr-40 Torr in order to provide uniform and efficient heat transfer to the wafer.

In alternative embodiments, the heating of the substrate may be accomplished by changing the chiller set point on the ESC, or by providing a second chiller at a higher temperature and provided fluid from the second chiller, or changing the temperature differential provided by the thermoelectric units, or by providing heat from the heat lamp array. Lifting pins may be used to raise the substrate off of the chuck before the substrate is heated with the heating lamps. In another embodiment, the frozen layer may be exposed to RF plasma that is created from gases that react with organic materials to form volatile compounds. These gases include, but are not limited to $H_2$, $N_2$, $NH_3$, $O_2$, $CO_2$, CO, $N_xO_y$, $SO_x$ and combinations thereof. Furthermore, additional inert gases, such as Ar, Kr, or Ne, may be added to provide ion energy to promote reactions. These plasmas can provide heat to the frozen layer and can promote the transition from frozen material to vapor species through synergistic chemical and ion-enhanced reactions. The plasma may be capacitive or inductive. Alternatively, a downstream plasma may be used to eliminate ion bombardment on the wafer.

The sublimation vapor is released into the chamber and is transported to the condenser. The condenser temperature is set below the ESC contact layer 112 temperature; the condenser is preferably between $-20°$ C.--$100°$ C. The condenser pressure will be similar to the drying chamber and preferably they share the same vacuum system.

The wafer is held at the desired chamber pressure and temperature until the endpoint of the drying step is detected. In one embodiment the endpoint can be detected by the use of a capacitance gauge and a pirani pressure gauge. These gauges will read differently when solvent vapor is in the chamber, but will converge to the same value when the drying endpoint occurs. Alternative methods for detecting drying endpoint also could include isolating the chamber from the vacuum pumps and checking the leak rate of the chamber, which is expected to be much higher if vapor is being generated from the wafer. If RF plasma is used, optical emissions spectroscopy can be used to endpoint the drying step by monitoring the wavelengths corresponding to the volatile reaction product species. In some applications, a condenser may not be used.

In one embodiment after the sublimation of the frozen layer is complete, the wafer/ESC may be heated to a temperature near or above the melting temperature of the freeze-drying solvent. For tert-butanol, the desired temperature would be in the range of $-40°$ C. to $+300°$ C. The pressure of the chamber will be lowered to a pressure in the range of 760 Torr to 0.1 mTorr. Preferably, the pressure in this step is <10 mTorr. Inert gas may be introduced into the chamber at a constant flow rate during this step. The purpose of this step is to remove any physically adsorbed solvent. This step may not be necessary for achieving damage-free drying for certain freeze-drying solvents or certain types of microelectronic topographies. In an alternative embodiment, the wafer may be exposed to an RF plasma that is created from gases that react with organic materials to form volatile compounds. These gases include, but are not limited to $H_2$, $N_2$, $NH_3$, $O_2$, $CO_2$, CO, $N_xO_y$, $SO_x$ and combinations thereof. Furthermore, additional inert gases, such as Ar, Kr or Ne, may be added to provide ion energy to promote reactions. These plasmas can provide heat to and react with the residual solvent to form vapor species through synergistic chemical and ion-enhanced reactions. In other embodiments, the heating of the wafer may occur by heating the ESC via a change in the chiller set point temperature or by heaters within the ESC, or by using lamps that emit infrared radiation that is absorbed by the wafer, or via a RF plasma.

In other embodiments, after completion of the secondary drying, the pressure of the chamber may be adjusted to a pressure that allows plasma to be ignited. Preferably, the pressure is adjusted to a range of 50 mTorr to 10,000 mTorr. The wafer may be exposed to an RF plasma that is created from gases that react with organic materials to form volatile compounds. These gases include, but are not limited to $H_2$, $N_2$, $NH_3$, $O_2$, $CO_2$, CO, $N_xO_y$, $SO_x$ and combinations thereof. Furthermore, additional inert gases, such as Ar, Kr or Ne, may be added to provide ion energy to promote reactions. The purpose of this step is to use dry plasma chemistry to remove any non-volatile residues that may have been contained in the wet etch, clean, or freeze drying acids/solvents and subsequently deposited on the wafer during the drying process. Furthermore, energy from the plasma may release any features that may have collapsed during processing. In some embodiments, this step may be eliminated, or may occur simultaneously with the drying step or may occur in a separate chamber.

In various embodiments, during the removal of the substrate, the chamber pressure is increased to 760 Torr by the introduction of an inert gas, such as but not limited to N2, Ar, or He. The wafer is discharged from the ESC and any wafer backside gas flow is shut off. The wafer is then removed from the chamber. In one embodiment a plasma from an inert gas energized with RF power may be used to discharge the wafer from the ESC. The wafer may be discharged before, simultaneously, or after the chamber pressure has been increased to atmospheric pressure. In another embodiment, the wafer may be moved to another chamber for plasma treatment.

Figure 6:
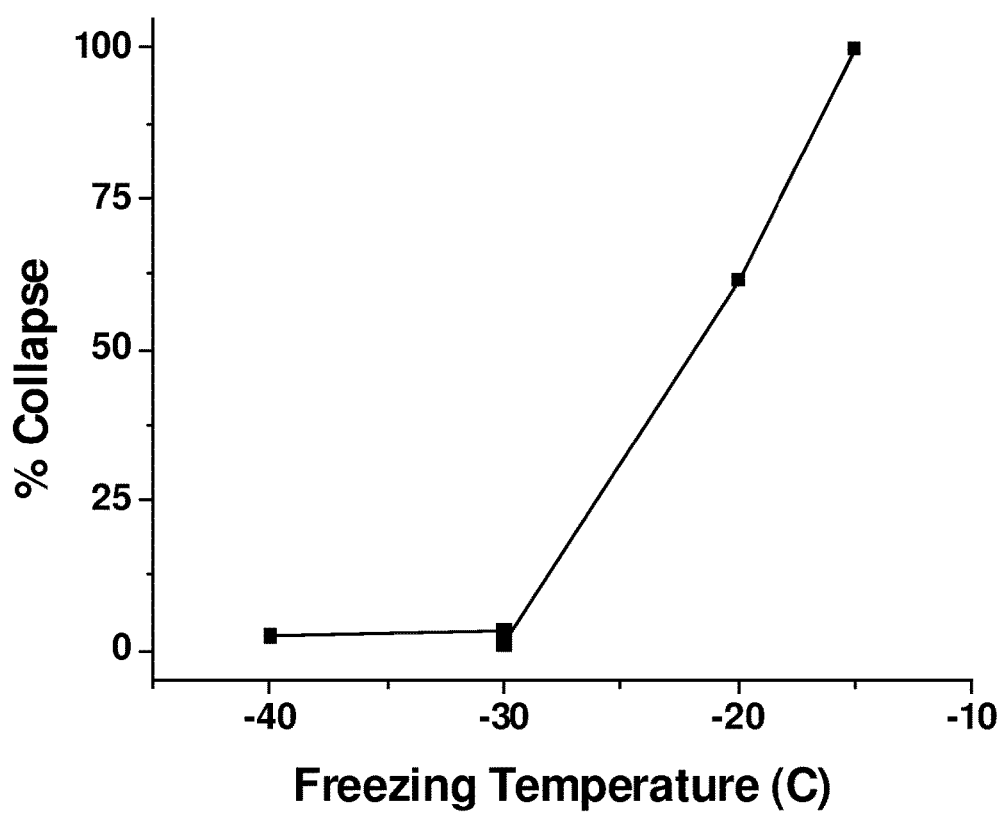
FIG. 6 is a graph of percent collapse versus freezing temperature.

In another embodiment, a series of experiments were carried out on cylindrical structures on a Si wafer with an aspect ratio of 15:1. The structures were wet with pure tert-butanol and placed inside a chamber. The samples were cooled to different freezing temperatures ranging from −15° C. to −40° C. After freezing the tert-butanol on the wafers, the chamber pressure was lowered to 300 mTorr and the wafer temperature was increased to +25° C. for 10 min. All of the tert-butanol was removed via sublimation. Afterwards, the chamber pressure was lowered to 30 mTorr and the wafer temperature was increased to 30° C. for 10 min. The chamber was then vented back to atmospheric pressure and the wafer samples were removed from the chamber. FIG. 6 is a graph of percent collapse versus freezing temperature. As seen in FIG. 6, the samples show <1% collapse when the freezing temperature is ≤−30° C.

It was unexpectedly found that using pure TBA caused unexpected collapse patterns. It was found that a TBA to water solution ratio of 9:1 by weight provided an unexpected reduction of damage. More generally, the weight ratio of TBA to water solution used in embodiments of the invention is from 5:95 to 99.9:0.1

In other embodiments, annealing may be used to increase the crystal structure of the frozen drying chemistry, which reduces collapse. In another embodiment, cooling below the glass transition temperature of the frozen drying chemistry is used to reduce collapse. In another embodiment the application of the drying chemistry and the freeze drying may be accomplished in the same chamber.

The configuration of an embodiment using an electrostatic chuck for quick cooling allows the chamber to be low volume with a gap between the chamber top and the top of the substrate having a small gap less than 3 cm. Such a low volume allows for faster pressure changes and better temperature control.

In another embodiment of the invention, a plurality of ESCs with each ESC holding a substrate so that a plurality of substrates is processed at the same time is in a single drying chamber. The ESCs may be in a single plane or may be stacked.

By eliminating the vapor-liquid interface an embodiment of the invention eliminates capillary forces that cause the collapse of features during traditional evaporation drying.

Various embodiments have advantages over supercritical drying processes. One advantage is that since embodiments of the invention operate in atmospheric or vacuum based pressures, high pressure vessels required in supercritical processes are not needed. Another advantage is that less chemicals are required than the amount of chemicals used in supercritical process. In addition the interaction of the drying solvent with the chamber in various embodiments is minimized compared to supercritical processes, which thus reduce wafer defects and contamination issues and increases the mean time to failure for the chamber. In addition, various embodiments reduce the drying time and allows for more precise temperature control. In addition, the pressure used in various embodiments of the invention allows for a plasma to be ignited, which provides the ability to dry clean residual solvent/contamination, which improves device yield.

Various embodiments eliminate the need for special bracing of high aspect ratio features, which reduces overall process complexities and costs. These embodiments can be applied to all types of microelectronic topography, whereas bracing is limited to very specific applications.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for freeze drying a drying chemistry liquid filling high aspect ratio features on a wet substrate, comprising:
    displacing liquid in the high aspect ratio features with a liquid form of a drying chemistry by flowing the liquid form of the drying chemistry over the substrate, such that the liquid form of the drying chemistry fills at least a portion of the high aspect ratio features, wherein the drying chemistry comprises at least one of tert-butanol, dimethyl sulfoxide (DSMO), cyclohexane, acetic acid, carbon tetrachloride, isopropanol, and dimethyl carbonate, wherein the high aspect ratio features have a critical dimension (CD) of less than 40 nm and a pitch of less than 80 nm;
    transferring the wet substrate into a drying chamber;
    sealing the drying chamber;
    placing the wet substrate on an electrostatic chuck in the chamber;
    chucking the substrate to the electrostatic chuck;
    using the electrostatic chuck to back side cool the substrate below the freezing point of the drying chemistry to freeze the drying chemistry;
    reducing the pressure in the chamber to remove the frozen drying chemistry; and
    heating the substrate in a temperature-controlled manner to vaporize the drying chemistry without melting the drying chemistry.

2. The method, as recited in claim 1, further comprising precooling the electrostatic chuck to a temperature below the freezing point of the drying chemistry before placing the substrate on the electrostatic chuck.

3. The method, as recited in claim 1, further comprising providing an inert or reducing gas to provide an oxygen free atmosphere within the chamber.

4. The method, as recited in claim 1, wherein the using the electrostatic chuck to back side cool the substrate causes the drying chemistry to freeze to complete solidification, while eliminating meta stable states of the drying chemistry.

5. The method, as recited in claim 1, wherein the drying chemistry comprises water and tert-butanol.

6. The method, as recited in claim 1, wherein heating the substrate in a temperature-controlled manner comprises using the electrostatic chuck to back side heat the substrate, while controlling the temperature of at least a portion of the electrostatic chuck.

7. The method, as recited in claim 6, wherein using the electrostatic chuck to back side heat the substrate comprises heating the back side of the substrate with a thermoelectric unit embedded in the electrostatic chuck.

8. The method, as recited in claim 7, further comprising providing a cooling source to the electrostatic chuck and heating the back side of the substrate with the thermoelectric unit.

9. The method, as recited in claim 7, wherein a temperature differential is provided between a part of the electrostatic chuck in which the at least one thermoelectric unit is embedded and a remainder of the electrostatic chuck.

10. The method, as recited in claim 1, wherein heating the substrate in a temperature-controlled manner comprises heating the substrate with one or more heat lamps while controlling the temperature of the substrate.

11. The method, as recited in claim 1, wherein the step of transferring takes place at ambient pressure.

* * * * *

UNITED STATES PATENT AND TRADEMARK OFFICE
CERTIFICATE OF CORRECTION

PATENT NO.        : 9,673,037 B2
APPLICATION NO.   : 13/273090
DATED             : June 6, 2017
INVENTOR(S)       : Sirard et al.

Page 1 of 1

It is certified that error appears in the above-identified patent and that said Letters Patent is hereby corrected as shown below:

On the Title Page

Item (73) Assignee – change "Law Research Corporation" to --Lam Research Corporation--

Signed and Sealed this
First Day of May, 2018

Andrei Iancu
*Director of the United States Patent and Trademark Office*